United States Patent [19]

Komatsu

[11] Patent Number: 4,894,540

[45] Date of Patent: Jan. 16, 1990

[54] IMAGE FORMING METHOD USING SECONDARY ELECTRONS FROM OBJECT FOR NOISE ELIMINATION

[75] Inventor: Fumio Komatsu, Fuchu, Japan

[73] Assignee: Kabushiki Kaisha Toshiba, Kawasaki, Japan

[21] Appl. No.: 257,557

[22] Filed: Oct. 14, 1988

[30] Foreign Application Priority Data

Oct. 14, 1987 [JP] Japan ................................ 62-259208

[51] Int. Cl.⁴ ............................................. G21K 1/00
[52] U.S. Cl. .................................... 250/307; 250/310; 250/492.2; 250/492.3; 250/578; 364/521; 340/728; 382/66
[58] Field of Search ........... 250/310, 306, 307, 492.22, 250/492.2, 398, 578, 492.3; 364/521, 512; 340/728; 382/66, 60, 54

[56] References Cited

U.S. PATENT DOCUMENTS

| | | | |
|---|---|---|---|
| 4,511,980 | 4/1985 | Watanabe | 250/492.22 |
| 4,567,364 | 1/1986 | Kano et al. | 250/310 |
| 4,646,253 | 2/1987 | Rehme et al. | 250/310 |
| 4,719,456 | 1/1988 | Sproch et al. | 340/728 |
| 4,768,156 | 8/1988 | Whitehouse et al. | 364/521 |
| 4,800,511 | 1/1989 | Tanaka | 364/521 |

Primary Examiner—Carolyn E. Fields
Assistant Examiner—John A. Miller
Attorney, Agent, or Firm—Foley & Lardner, Schwartz, Jeffery, Schwaab, Mack, Blumenthal & Evans

[57] ABSTRACT

An image forming method includes a first step of irradiating a beam onto an object, and using an intensity corresponding to an image area onto which the beam was irradiated as an intensity of a pixel at the center of the image area, and scanning a beam throughout the inspection area of the object to obtain an image within the inspection area as a collection of pixels arranged at intervals smaller than a beam diameter; and a second step of assigning a pixel to be processed and neighboring pixels with coefficients in accordance with a beam intensity distribution, multiplying the intensity of each pixel by each assigned coefficient, determining a new intensity of the pixel to be processed in accordance with the sum of respective products, and repeating the new intensity determining process for all pixels necessary to be processed. In the second step, the value of the coefficients for those pixels except on the scanning direction may be reduced. Further, a third step may be provided for linearly-transforming the intensities so as to make the intensities of respective pixels to be distributed within a predetermined range.

12 Claims, 7 Drawing Sheets

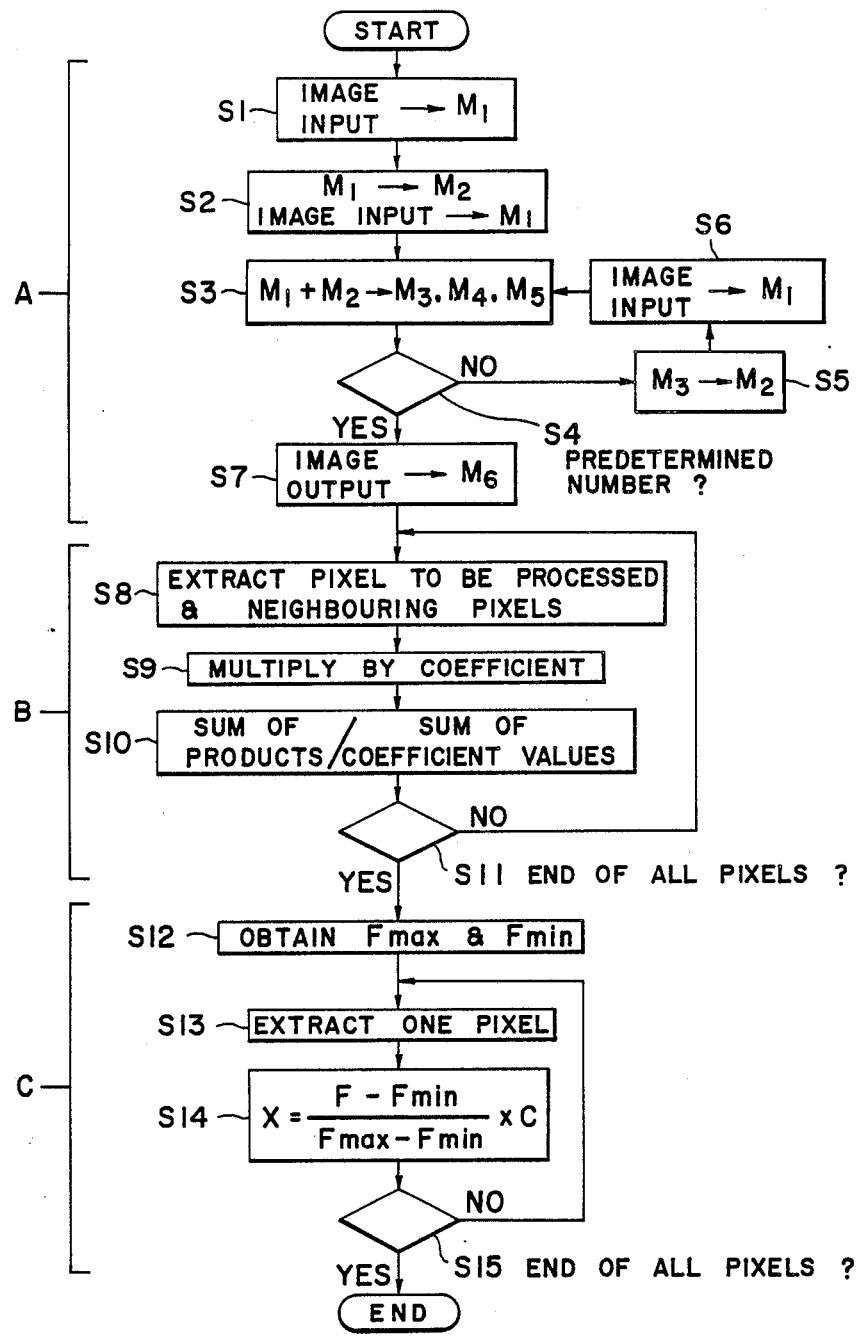
F I G. 1

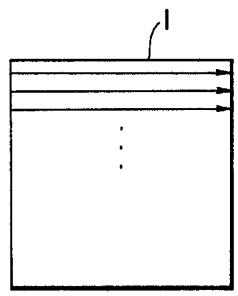
FIG. 2a
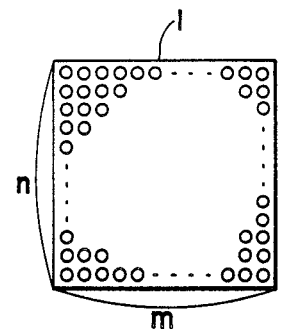
FIG. 2b
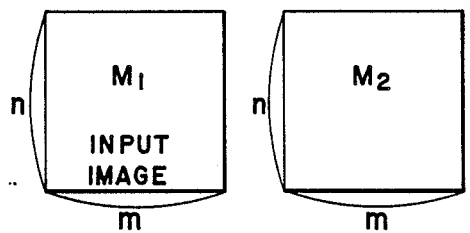
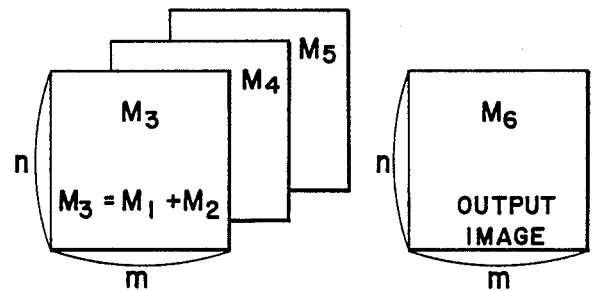
FIG. 3

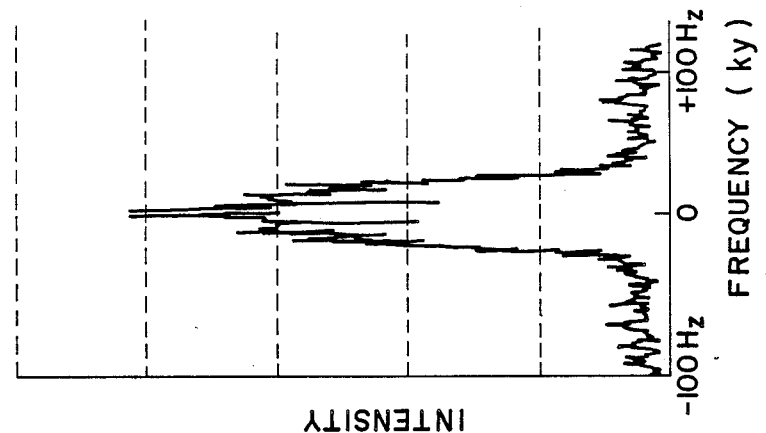

IMAGE FORMING METHOD USING SECONDARY ELECTRONS FROM OBJECT FOR NOISE ELIMINATION

BACKGROUND OF THE INVENTION

1. Field of the Art

The present invention relates to an image forming method, and more particularly to an image forming method wherein an electron beam irradiates an object with a scanning electron microscope, and secondary electrons from the object are used to form an image of the object.

2. Prior Art

In measuring a pattern of a semiconductor integrated circuit, an image of the pattern is formed using a scanning electron microscope (hereinafter abbreviated as SEM). It is known that various types of noises are generated while forming an image with SEM so that the image is superimposed with noises. Such noises include distribution noises of a primary beam from SEM, and noises generated during secondary electron emission. The former noises are generated because a fraction of the electron beam emitted from a cathode and running within the column of the SEM are captured by an intermediate aperture with a certain probability before they reach the surface of an object. The latter noises are generated because the physical phenomenon of secondary electron emission is essentially a phenomenon based on probability. Other noises may be generated from components such as a photomultiplier, A/D converter and the like in the measuring system.

In order to form an image not susceptible to such noises, the following methods have been adopted heretofore:

(1) eliminating high frequency noises of an image with a low-pass filter;

(2) scanning an object plural times to use an addition and averaging processing;

(3) smoothing an image with a spatial filter processing;

(4) using a median value of pixel intensities of an image within a predetermined area through median filtering processing; and (5) performing a frequency analysis of an image through fast Fourier transformation.

With the above methods, noises are not eliminated sufficiently to form a clear image because of the following reasons.

(1) First, the method of using a low-pass filter poses a problem that it is very difficult to set an optimum cut-off frequency. The frequency of noises on a SEM image varies with an object. Since a semiconductor integrated circuit has a number of image objects, it is very difficult to set an optimum cut-off frequency for all the image objects.

(2) With a conventional method of using an addition and averaging processing, proper noise elimination is not possible for the case where noises are continuously generated at a certain fixed frequency.

(3) The smoothing method poses a problem that the image quality after smoothing is dependent on the values of spatial filtering matrix and the quantitative evaluation of an image is affected. It also has a problem of lowering the contrast of an image.

(4) The method of using median filtering processing has been used as a technique of preserving information on pattern edge. This method is not so much effective for an image forming system wherein information whose dimension is substantially the same as the beam diameter of SEM is superposed on noises.

(5) Fourier transformation can sufficiently eliminate noises. However, a presently available processor used for image processing is not so fast as to sufficiently perform Fourier transformation.

SUMMARY OF THE INVENTION

It is therefore an object of the present invention to provide an image forming method capable of forming a clear image with noises sufficiently eliminated.

According to a first aspect, an image forming method comprises:

a first step of irradiating a beam onto an object, and using an intensity corresponding to an image area onto which the beam was irradiated as an intensity of a pixel at the center of the image area, and scanning a beam throughout the inspection area of the object to obtain an image within the inspection area as a collection of pixels arranged at intervals smaller than a beam diameter; and a second step of assigning a pixel to be processed and neighbouring pixels with coefficients in accordance with a beam intensity distribution, multiplying the intensity of each pixel by each assigned coefficient, determining a new intensity of the pixel to be processed in accordance with the sum of respective products, and repeating the new intensity determining process for all pixels necessary to be processed, to, thus, form a clear image.

According to a second aspect, an image forming method comprises: the step of, after assigning a pixel to be processed and neighboring pixels with coefficients in accordance with a beam intensity at the second step of the first aspect, reducing the value of the assigned coefficients to those neighbouring pixels except those on the scanning direction, to thus enable more efficient noise elimination.

According to a third aspect, a first step of irradiating a beam onto an object to use an intensity corresponding to an image area onto which the beam was irradiated as an intensity of a pixel at the center of the image area, scanning a beam throughout the inspection area of the object to obtain an image within the inspection area as a collection of pixels arranged at intervals smaller than a beam diameter, repeating plural times the beam scanning, averaging a sum of intensities of the same pixel obtained through the plural beam scannings to obtain an image of the object within the inspection area as a collection of pixels with averaged intensities;

a second step of assigning a pixel to be processed and neighbouring pixels with coefficients in accordance with a beam intensity distribution, multiplying the intensity of each pixel by each assigned coefficient, determining a new intensity of the pixel to be processed in accordance with the sum of respective products, and repeating the new intensity determining process for all pixels necessary to be processed; and a third step of linear-transforming the intensities of respective pixels such that the intensities are distributed within a predetermined range, to thus form a clear image.

The image forming method according to the first aspect is applicable for a system wherein an object is scanned under the condition that a beam diameter is larger than that of each pixel. Under such condition, the beam can be irradiated onto a plurality of pixel areas.

The principal feature of this invention is that the intensity of each pixel obtained by means scanning is corrected in accordance with the neighbouring pixel intensities to obtain a clear image. Such correction is performed with weighted neighbouring pixels. Weighting is determined in accordance with a beam intensity distribution. With such correction, it becomes possible to form a clear image with noise components eliminated.

In contrast with the first aspect, the second aspect features in that the weighting is determined while taking into consideration not only the beam intensity distribution but also the beaming scanning direction. This relies on the experimental result that a good image can be obtained by lowering the degree of weighting neighbouring pixels not on the beam scanning direction.

The third aspect comprises three image processing steps, namely, an adding/averaging processing, a spatial filtering processing, and a linear image enhancement processing. In the adding/averaging processing, the average of intensities obtained at plural scannings is used as the intensity of each pixel. The spatial filtering processing is a correction process in accordance with neighbouring pixel intensities, which process is the main subject of the first and second aspects. The linear image enhancement processing is a process to linearly-transform the intensity so as to distribute respective pixel intensities within a predetermined range. With the above three processes, it becomes possible to efficiently eliminate noises and form a clear and high-contrasted image.

BRIEF DESCRIPTION OF THE DRAWINGS

In the accompanying drawings:

FIG. 1 is a flow chart showing the procedure of an embodiment of the image forming method according to the present invention;

FIGS. 2A and 2B illustrate the method of scanning an object according to the present invention;

FIG. 3 illustrates the memory arrangement used at the step A of the image forming method according to the present invention;

FIGS. 4A and 4B and FIGS. 5A and 5B are graphs showing the power spectrum of intensities before and after the adding/averaging processing at the step A of the image forming method of this invention;

DETAILED DESCRIPTION OF THE PREFERRED EMBODIMENT

Figure 4B:
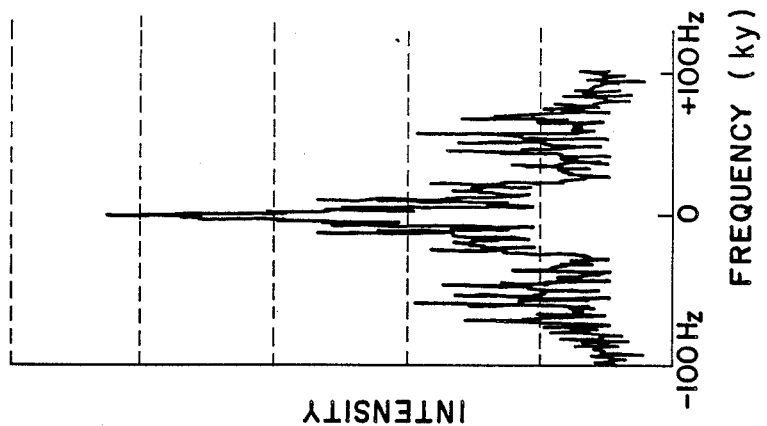

A preferred embodiment of the present invention will now be described with reference to the accompanying drawings. FIG. 1 is a flow chart showing an embodiment of the procedure of the image forming method. As shown in the flow chart, this embodiment which constitutes the third aspect is constructed of first to third steps, namely, an adding/averaging process A, spatial filtering process B, and linear image enhancement process C. The first and second aspects are concerned with the spatial filtering processing B among the three processings. The above steps will now be described in this order while using a SEM.

First Step

The first step or adding/averaging processing A starts from scanning an object with a beam. FIGS. 2A and 2B illustrate such beam scanning. As shown in FIG. 2A, the inspection area 1 of an object is scanned in the direction indicated by an arrow with a primary electron beam from SEM. The scanning direction is horizontal in the drawing, and the horizontal direction is assumed to be used in the following description. After completion of scanning a first row, a second row is scanned in the similar manner, and all the rows are scanned as well. Secondary electrons are emitted from the object upon irradiation of a primary electron beam onto the object. The amount of secondary electrons is measured at predetermined sampling timings so that pixels disposed at these sampling timings in a matrix area are obtained as shown in FIG. 2B. The amount of secondary electrons measured at the sampling timings corresponds to the intensity of a pixel concerned. Once scanning has been completed for all the rows, an image made of a collection of pixels in m×n two-dimensional matrix can be obtained. In this embodiment, six memories M1 to M6 are provided for storing an image as shown in FIG. 3. Each memory has memory cells disposed in m×n two-dimensional matrix corresponding to the pixel arrangement shown in FIG. 2B. Each memory cell has a depth of 8 bits. Thus, the pixel intensity is expressed by one of a value from 0 to 255 and stored in the corresponding memory cell.

Referring to the flow chart shown in FIG. 1, first at step S1, an image is inputted to memory M1. Namely, after completely scanning the entirety of the inspection area 1, the intensities of all pixels as shown in FIG. 2B are inputted to memory M1. This is performed by writing digital signals obtained by A/D converting output signals from SEM in the memory M1 at particularly addressed areas. In this embodiment, data directly obtained through SEM scanning are always inputted to memory M1.

Upon completion of the first scan, the data of memory M1 is copied to memory M2 at step S2. The second scan is carried out in the similar manner to step S1 to write the obtained data in memory M1. At step S3, the data of memories M1 and M2 are added together and the sum is inputted to memory M3. In particular, the data in a memory cell of memory M1 are added to the data in a corresponding memory cell of memory M2, and the addition result is stored in a corresponding memory cell of memory M3. If the addition result overflows, the data in a corresponding memory cell in memory M4 are incremented by 1. Further, if the addition result over-flows, the data in a corresponding memory cell in memory M5 are incremented by 1. In other words, memory M4 serves as the upper bits of memory M3 whereas memory M5 serves as the upper bits of memory M4. Thus, an accumulated value up to 24 bits can be stored.

After addition at step S3, it is checked if the predetermined number additions has been carried out or not. The larger the number of additions is set, the more reliable the average that can be obtained. However, the number of additions should be set so as to match the actual measurement condition because it is necessary to repeat scanning the object as many times as the number of additions.

If a predetermined number of additions was performed, then at step S5 the data of memory M3 is directly copied to memory M2. At step S6, an image is inputted to memory M1. This operation at step S6 is quite the same as that at steps S1 and S2 wherein the intensity data of pixels obtained by scanning the inspection area 1 are inputted to memory M1. After the third scan. Again at step S3, the data of memories M1 and M2 are added together to write the addition result in memory M3. The loop processing at steps S4, S5, S6 and S3 is repeated predetermined times. After the inspection area 1 has been scanned predetermined times, the result is accumulated in real time in memories M3 to M5. Thereafter, at step S7 the accumulated value of each pixel intensity is divided by the number of accumulations to thus obtain an average intensity which is stored in memory M6. Thus, the last output image in the adding/averaging processing A can be obtained in memory M6.

Figure 4A:
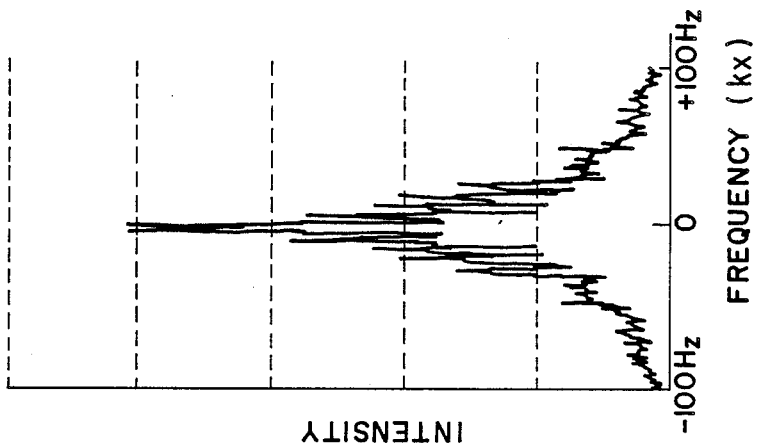

High frequency noise components inherent to a SEM can be eliminated by the above-described adding-/averaging processing. Such noise elimination is illustrated in FIGS. 4A and 4B and FIGS. 5A and 5B. FIG. 4A shows a power spectrum of an intensity of a scanned image (corresponding to that shown in FIG. 2B) relative to the scanning direction (the horizontal direction in FIG. 2A). FIG. 4B shows a power spectrum relative to the direction perpendicular to the scanning direction (the vertical direction in FIG. 2A). In FIGS. 4A and 4B and FIGS. 5A and 5B, the abscissa represents a frequency (Kx, Ky) with a central frequency indicated by 0 and frequency shifts therefrom indicated by + and − in the right and left directions, respectively, and the ordinate represents an intensity of the frequency components. Both graphs show a DC component peak at the central frequency, and high frequency components (noise components) on both sides. FIGS. 5A and 5B show the power spectrums relative to the scanning direction and the direction perpendicular thereto, after completion of scanning an object and performing the adding/averaging processing eight times. From the comparison between FIGS. 4A and 4B and FIGS. 5A and 5B, it can be understood that substantial noise components have been eliminated through the adding-/averaging processing.

Second Step

Figure 6A:
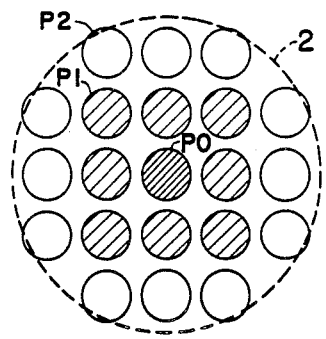
FIGS. 6A to 6E illustrate the step B of the image forming method of this invention.

The second step or spatial filtering processing B is a step to correct each pixel intensity of an outputted image (image in memory M6) at the first step, in accordance with the intensities of neighbouring pixels. The main principle thereof will first be described with reference to FIG. 6A. The diameter of a beam spot indicated by a broken line is larger than that of each pixel indicated by a solid line. A beam is thus irradiated upon 21 pixels in total, i.e., a central pixel P0, adjacent 8 pixels P1 and 12 pixels P2 outside of the adjacent pixels. The amount of secondary electrons measured at this beam irradiating area is used as the intensity of the central pixel P0 and stored in memory M1 at the above-described first step. The intensity of a next pixel on the right side of the pixel P0 corresponds to the amount of secondary electrons measured when the beam spot 2 is shifted to the right by one pixel amount. The diameter of a beam spot becomes relatively large when SEM is operated at low acceleration voltage. In this embodiment, the beam diameter of 850 Å and a pixel diameter of 174 Å were used.

Figure 6B:
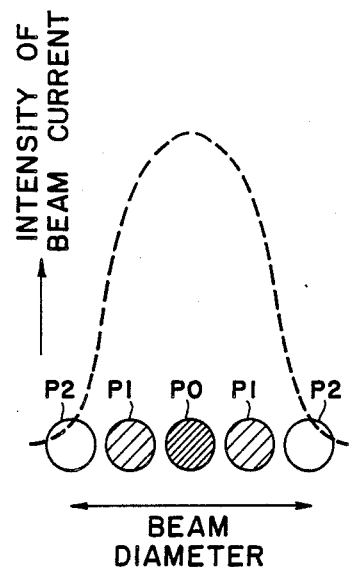
Figure 6C:
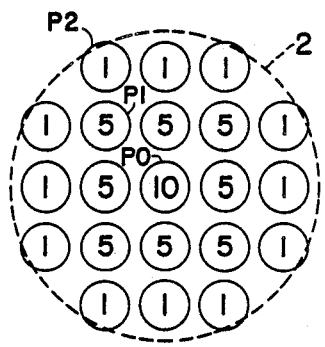

Generally, the primary electron beam of SEM has a beam current intensity distribution (normally Gaussian distribution) as indicated by a broken line in FIG. 6B. The beam intensity ratio among respective pixels P0 to P2 can be obtained through comparison between the positions of pixels and the beam current intensity distribution shown in FIG. 6B. In this example, the beam intensity ratio among pixels P0, P1 and P2 is about 10:5:1. Coefficients are assigned to respective pixels in accordance with the beam intensity ratio, as shown in FIG. 6C. The intensity of each pixel is multiplied by the coefficient. All the products are added together to obtain a new intensity of the pixel P0. It means that the intensity of the pixel P0 has been corrected in accordance with the intensities of neighbouring pixels.

Figure 6D:
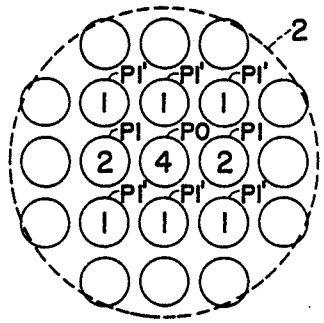

In the present embodiment, only the eight pixels (pixels P2 shown in FIG. 6C) adjacent to the pixel to be corrected have been used in such a correction process, and the weighting values of the coefficients of pixels not on the scanning direction have been reduced. Namely, the actual coefficients as used become as shown in FIG. 6D. The coefficients of pixel P0 and P1 are 4 and 2, respectively, in accordance with the beam current intensity distribution, and the coefficients of adjacent pixels P1' not on the scanning direction are reduced to 1 instead of 2. As appreciated from the comparison between FIGS. 4A and 4B, the amount of noise components is different in the scanning direction and in the direction perpendicular thereto. It was confirmed from the experiments that a good image forming is possible by reducing the values of the coefficients of adjacent pixels not on the scanning direction.

Figure 6E:
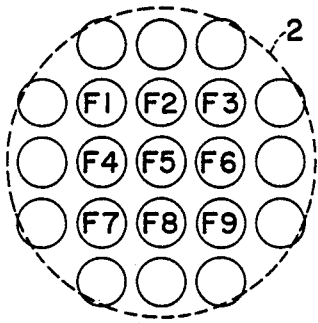

The above-described spatial filtering processing is carried out in accordance with the procedure shown in the flow chart of FIG. 1. First, at step S8 a pixel to be processed and adjacent 8 pixels are extracted. For instance, pixels P0 and P1 shown in FIGS. 6A to 6E are extracted. Next, at step S9, the coefficients and intensities or respective pixels are multiplied together. Namely, the intensities F1 to F9 specific to respective pixels as shown in FIG. 6E are multiplied by the corresponding coefficients shown in FIG. 6E. At step S10, the products are added together and the resultant sum is divided by the sum of coefficient values. The division result is used as a new intensity f pixel P0. In particular, the sum S of products is expressed as:

$$S = F1 + F2 + F3 + 2F4 + 4F5 + 2F6 + F7 + F8 + F9.$$

The sum S divided by the sum of coefficient values, i.e., 14 becomes a new intensity S/14 of pixel P0 after correction. Such correction process is performed for all pixels (S11). This correction process cannot be carried out for peripheral pixels because they have no such neighbouring pixels. However, the peripheral portion of an image normally has no significant information, thus leaving no problem.

Figure 7B:
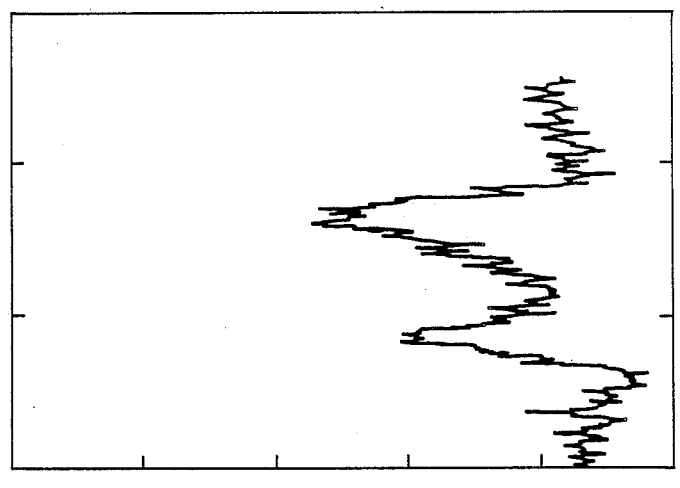
FIGS. 7A and 7B are graphs showing the pixel intensity distribution before and after the spatial filtering processing at the step B of the image forming method of this invention.
Figure 7A:
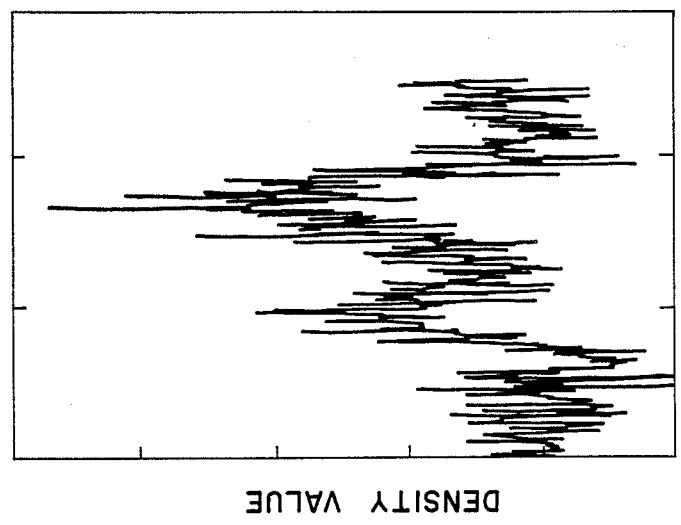

The above-described spatial filtering processing B can substantially eliminate high frequency noise components, which is illustrated by the graphs of FIGS. 7A and 7B. FIG. 7A is a graph showing the intensities of pixels on a scanning direction before the spatial filtering processing B, and FIG. 7B is a graph after the spatial filtering processing B. The abscissa represents the position of pixel, and the ordinate represents the intensity of pixel. Through comparison between the graphs of FIGS. 7A and 7B, it is appreciated that the noise components are efficiently eliminated.

Third Step

In the third step or linear image enhancement processing C, an image processed up to the above-described second step is to be linearly-transformed in order to improve the image contrast. In particular, at step S12 shown in FIG. 1, a maximum value $F_{max}$ and a minimum value $F_{min}$ among all the pixel intensities are obtained. Next, at step S13, a pixel to be processed is extracted whose intensity F is subjected to the following calculation to obtain a new intensity X:

$$X = C(F - F_{min})/(F_{max} - F_{min})$$

where C is an arbitrary constant.

The above process is performed for all the pixels (step S15) so that the intensities of respective pixels distribute in the range from 0 to C. For instance, assuming that C=255, the intensity of each pixel is expressed as one of the values 0 to 255, in 256 steps. If a logarithmic calculation is performed at step S14, the contrast emphasizing can also be effected.

Figure 8:
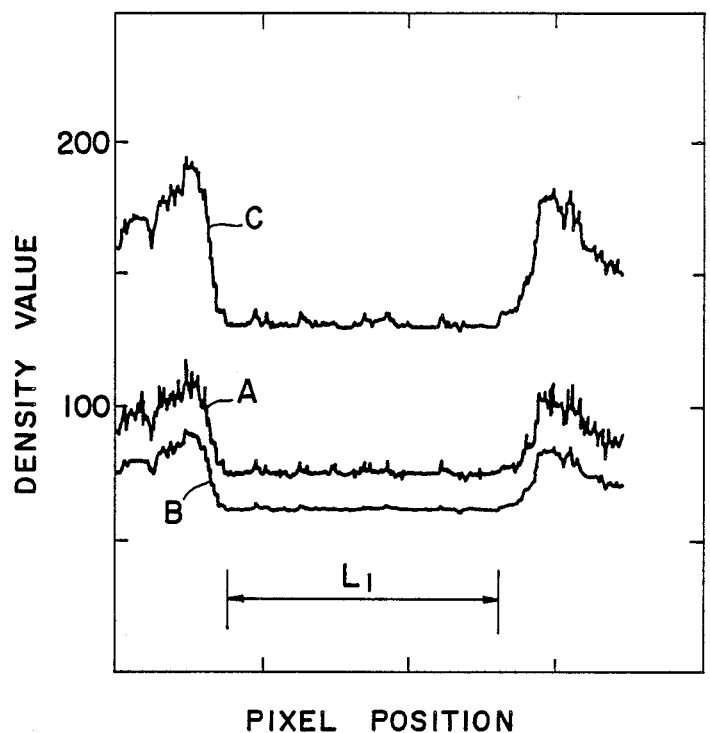
FIG. 8 is a graph showing the pixel intensity distribution at the respective steps of the image forming method of this invention.
Figure 9:
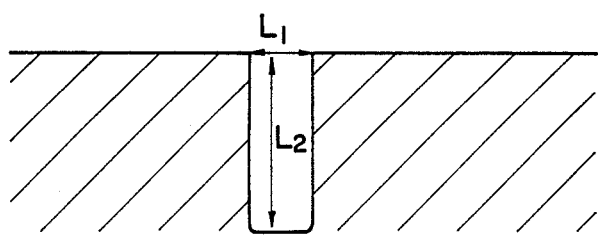
FIG. 9 is a cross section of an object from which the graph shown in FIG. 8 was obtained.

The graph of FIG. 8 shows the results obtained while forming an image of a resist pattern formed on a semiconductor substrate shown in FIG. 9, in accordance with the procedure shown by the flow chart of FIG. 1. A hole pattern shown in FIG. 9 having a hole diameter L1=1.2 micron and depth L2=3.6 micron was scanned with SEM, and the obtained pixel intensities of the image are shown in the graph of FIG. 8. The abscissa of FIG. 8 represents a pixel position corresponding to the horizontal position in FIG. 9, and the ordinate represents a pixel intensity (expressed in terms of 8 bit digital value). The graph A represents the intensities after the adding/averaging processing A shown in FIG. 1, the graph B represents the intensities after the spatial filtering processing B, and the graph C represents the intensities after the linear image enhancement processing. It is to be noted that the noise components shown in the graph A are reduced in the graph B, and the contrast is emphasized in the graph C as compared with the graph B.

It can be understood that a clear and noise-eliminated image is obtained after undergoing the three processings. According to the method described with the above embodiment, an image of a hole pattern even with a size in the order of several submicrons and with a relatively large aspect ratio can be obtained generally clearly. Thus, the invention is effective particularly for the formation of an image of a minute uneven pattern on a semiconductor integrated circuit. Obviously, the invention is applicable to any kind of objects so long as the image forming method used a beam scanning is applied. The beam is not limited to an electron beam, but an optical beam may also be used.

As appreciated from the foregoing description of the image forming method, the intensity of a pixel is corrected by using a spatial filtering processing, in accordance with the intensities of neighbouring pixels. Therefore, a clear image whose noises have been sufficiently eliminated can be obtained. Further, a scanned image is subjected to three processings including an adding-/averaging processing, spatial filtering processing and linear image enhancement processing, so that a more clear image can be obtained.

I claim:

1. An image forming method comprising:
   the first step of irradiating a primary beam, having a beam diameter, onto an object, using an intensity corresponding to an image area onto which the beam was irradiated as the intensity of a pixel at the center of said image area, and scanning a beam throughout an inspection area of said object to obtain an image within said inspection area as a collection of pixels arranged at intervals smaller than the beam diameter; and
   the second step of assigning a pixel of said collection of pixels to be processed and neighboring pixels with coefficients in accordance with a secondary beam intensity distribution, multiplying the intensity of each pixel by each assigned coefficient, determining a new intensity of said pixel to be processed in accordance with the sum of the respective products, and repeating the new intensity determining process for pixels to be processed.

2. An image forming method according to claim 1, wherein irradiation and scanning of said primary beam, and obtaining said intensities, are carried out using a scanning electron microscope.

3. An image forming method according to claim 2, wherein said secondary beam intensity distribution is a Gaussian distribution.

4. An image forming method comprising:
   the first step of irradiating a primary beam, having a beam diameter, onto an object, using an intensity corresponding to an image area onto which the beam was irradiated as the intensity of a pixel at the center of said image area, and scanning a beam throughout an inspection area of said object to obtain an image within said inspection area as a collection of pixels arranged at intervals smaller than the beam diameter; and
   the second step of assigning a pixel of said collection of pixels to be processed and neighboring pixels among those pixels of an image obtained by said first step, with coefficients in accordance with a secondary beam intensity distribution, reducing the value of the assigned coefficients to those neighboring pixel, except those in the scanning direction, multiplying the intensity of each pixel by each assigned coefficient, determining a new intensity of said pixel to be processed in accordance with the sum of respective products, and repeating the new intensity determining process for pixels to be processed.

5. An image forming method according to claim 4, wherein irradiation and scanning of said primary beam, and obtaining said intensities are carried out using a scanning electron microscope.

6. An image forming method according to claim 5, wherein said secondary beam intensity distribution is a Gaussian distribution.

7. An image forming method comprising:
   the first step of irradiating a primary beam, having a beam diameter, onto an object, and using an intensity corresponding to an image area onto which the beam was irradiated as an intensity corresponding to an image area onto which the beam was irradiated as an intensity of a pixel at the center of said image area, and scanning a beam throughout an inspection area of said object to obtain an image within said inspection area as a collection of pixels arranged at intervals smaller than the beam diameter, repeating plural times the beam scanning, averaging a plurality of intensities of same pixels obtained through the plural beam scannings to obtain an image of the object with the inspection area as a collection of pixels with averaged intensities;

the second step of assigning a pixel of said collection of pixels to be processed and neighboring pixels with coefficients in accordance with a secondary beam intensities distribution, multiplying the intensity of each pixel by each assigned coefficient, determining a new intensity of said pixel to be processed in accordance with the sum of respective products, and repeating the new intensity determining process for pixels to be processed; and the third step of linearly-transforming the intensities of respective pixels such that the intensities are intensities within a predetermined range.

8. An image forming method according to claim 7, wherein irradiation and scanning of said primary beam, and obtaining said intensities, are carried out using a scanning electron microscope.

9. An image forming method according to claim 8, wherein said secondary beam intensity distribution is a Gaussian distribution.

10. An image forming method according to claim 7, wherein said third step, a maximum value $F_{max}$ of the intensities of respective pixels are obtained, and the intensity of each pixel is subjected to the following calculation to obtain a new intensity value X:

$$X = C(F - F_{min})/(F_{max} - F_{min})$$

where
C is a predetermined constant, and
F represents the intensity of a pixel to be processed.

11. A noise suppressing method for forming an image, comprising:

irradiating an object with a beam having a beam diameter;

using an intensity corresponding to an image area irradiated by the beam as the intensity of a pixel at the center of the image area;

scanning the beam throughout an inspection area of the object to obtain an image as a collectionof pixels arranged at intervals smaller than the beam diameter;

repeating the beam scanning operation to obtain an average of intensities of the same pixel;

assigning to a pixel to be processed and to neighboring pixels coefficients representing beam intensity distribution;

multiplying the intensity of each pixel by its assigned coefficient;

determining a new intensity of the pixel being processed as the sum of the multiplication products; and repeating the intensity determining process for each pixel being processed.

12. The method of claim 11, further including the step of linearly transforming the intensities of respective pixels such that the intensities are distributed within a predetermined range and thereby form a clear image.

* * * * *